(12) United States Patent
Savandaiah et al.

(10) Patent No.: US 11,581,166 B2
(45) Date of Patent: Feb. 14, 2023

(54) LOW PROFILE DEPOSITION RING FOR ENHANCED LIFE

(71) Applicant: APPLIED MATERIALS, INC., Santa Clara, CA (US)

(72) Inventors: Kirankumar Neelasandra Savandaiah, Bangalore (IN); Jiao Song, Singapore (SG); David Gunther, Santa Clara, CA (US); Irena H. Wysok, San Jose, CA (US); Anthony Chih-Tung Chan, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 169 days.

(21) Appl. No.: 16/945,445

(22) Filed: Jul. 31, 2020

(65) Prior Publication Data

US 2022/0037128 A1    Feb. 3, 2022

(51) Int. Cl.
| | | |
|---|---|---|
| *H01J 37/32* | (2006.01) | |
| *H01L 21/687* | (2006.01) | |
| *H01J 37/34* | (2006.01) | |
| *C23C 14/34* | (2006.01) | |

(52) U.S. Cl.
CPC ........ *H01J 37/32623* (2013.01); *C23C 14/34* (2013.01); *H01J 37/32642* (2013.01); *H01J 37/3405* (2013.01); *H01L 21/68735* (2013.01); *H01J 2237/022* (2013.01)

(58) Field of Classification Search
None
See application file for complete search history.

(56) References Cited

U.S. PATENT DOCUMENTS

| | | |
|---|---|---|
| D381,030 S | 7/1997 | Tepman |
| 5,803,977 A | 9/1998 | Tepman et al. |
| D401,252 S | 11/1998 | Gonzalez et al. |
| D403,334 S | 12/1998 | Gonzalez et al. |
| D403,337 S | 12/1998 | Or |
| 6,620,736 B2 * | 9/2003 | Drewery ........... H01J 37/32642 118/728 |
| D491,963 S | 6/2004 | Doba |
| D557,226 S | 12/2007 | Isozaki et al. |

(Continued)

FOREIGN PATENT DOCUMENTS

| | | |
|---|---|---|
| TW | D182534 | 4/2017 |
| TW | D187824 | 1/2018 |

OTHER PUBLICATIONS

International Search Report for PCT/US2021/043139, dated Nov. 16, 2021.

(Continued)

*Primary Examiner* — Jason Berman
(74) *Attorney, Agent, or Firm* — Moser Taboada

(57) ABSTRACT

Embodiments of deposition rings for use in a process chamber are provided herein. In some embodiments, a deposition ring includes: an annular body; an inner wall extending upward from an inner portion of the annular body; and an outer wall extending upward form an outer portion of the annular body to define a large deposition cavity between the inner wall and the outer wall, wherein a width of the large deposition cavity is about 0.35 inches to about 0.60 inches, wherein the outer wall includes an outer ledge and an inner ledge raised with respect to the outer ledge.

20 Claims, 2 Drawing Sheets

(56) References Cited

U.S. PATENT DOCUMENTS

| | | |
|---|---|---|
| D559,994 S | 1/2008 | Nagakubo et al. |
| D649,986 S | 12/2011 | Araki et al. |
| D659,175 S | 5/2012 | Araki et al. |
| D665,491 S | 8/2012 | Goel et al. |
| D694,340 S | 11/2013 | Laporte |
| D694,790 S | 12/2013 | Matsumoto et al. |
| D705,280 S | 5/2014 | Fujikata et al. |
| D709,538 S | 7/2014 | Mizukami |
| D738,451 S | 9/2015 | Olson |
| D767,234 S | 9/2016 | Kirkland et al. |
| D770,992 S | 11/2016 | Sato et al. |
| D796,458 S | 9/2017 | Jang et al. |
| D797,067 S | 9/2017 | Allen et al. |
| D797,691 S | 9/2017 | Achutharaman et al. |
| D798,248 S | 9/2017 | Ge et al. |
| D801,942 S | 11/2017 | Liu et al. |
| D810,705 S | 2/2018 | Chang et al. |
| D819,580 S | 6/2018 | Chang et al. |
| D825,504 S | 8/2018 | Allen et al. |
| D825,505 S | 8/2018 | Ge et al. |
| D836,572 S | 12/2018 | Riker et al. |
| D837,755 S | 1/2019 | Liu et al. |
| D851,613 S | 6/2019 | Chan et al. |
| D868,124 S | 11/2019 | Riker et al. |
| D869,409 S | 12/2019 | Riker et al. |
| D876,504 S | 2/2020 | Jun et al. |
| D877,101 S | 3/2020 | Johanson et al. |
| D888,903 S | 6/2020 | Gunther et al. |
| D891,382 S | 7/2020 | Kamath et al. |
| D894,137 S | 8/2020 | Chan et al. |
| D902,165 S | 11/2020 | Johanson et al. |
| D908,645 S | 1/2021 | Gunther et al. |
| 2006/0090706 A1 | 5/2006 | Miller et al. |
| 2006/0219172 A1* | 10/2006 | Kuo .................. C23C 14/50 118/728 |
| 2007/0102286 A1* | 5/2007 | Scheible ............. H01J 37/3447 204/298.01 |
| 2007/0283884 A1 | 12/2007 | Tiller et al. |
| 2008/0257263 A1 | 10/2008 | Pavloff et al. |
| 2008/0308416 A1 | 12/2008 | Allen et al. |
| 2009/0050272 A1* | 2/2009 | Rosenberg .......... C23C 16/4581 118/728 |
| 2010/0108500 A1 | 5/2010 | Hawrylchak et al. |
| 2011/0209985 A1 | 9/2011 | Birkmeyer et al. |
| 2012/0263569 A1 | 10/2012 | Breshnahan et al. |
| 2014/0190822 A1 | 7/2014 | Riker et al. |
| 2015/0190835 A1* | 7/2015 | Hawrylchak ....... C23C 16/4585 118/504 |
| 2015/0357169 A1 | 12/2015 | Ivanov et al. |
| 2016/0002788 A1 | 1/2016 | Borean et al. |
| 2016/0340775 A1 | 11/2016 | Rasheed et al. |
| 2017/0009367 A1 | 1/2017 | Harris et al. |
| 2017/0029941 A1 | 2/2017 | Allen et al. |
| 2019/0267220 A1 | 8/2019 | Scheible et al. |
| 2020/0090915 A1 | 3/2020 | Bolvardi et al. |

OTHER PUBLICATIONS

Search Report for Taiwan Design Application No. 110300413, dated May 30, 2021.

* cited by examiner

LOW PROFILE DEPOSITION RING FOR ENHANCED LIFE

FIELD

Embodiments of the present disclosure generally relate to a semiconductor processing equipment.

BACKGROUND

Deposition rings may be used in physical vapor deposition (PVD) chambers to protect chamber components, such as a substrate support, from unwanted deposition. Over time, the deposition ring accumulates deposited material from the deposition processes performed in the PVD chamber. For high deposition processes, deposition accumulation on the deposition ring builds up significantly to the point where the deposition can build up to the back of the substrate. At that point, the deposition can adhere or stick to the back of the substrate, which can cause substrate handling issues and lead to broken substrates. Although the deposition ring can be removed and replaced with a clean deposition ring, rapid accumulation of material deposited on the deposition ring leads to more frequent downtime to replace the deposition ring.

Accordingly, the inventors have provided embodiments of improved deposition rings as disclosed herein.

SUMMARY

Embodiments of deposition rings for use in a process chamber are provided herein. In some embodiments, a deposition ring for use in a process chamber includes: an annular body; an inner wall extending upward from an inner portion of the annular body; and an outer wall extending upward form an outer portion of the annular body to define a large deposition cavity between the inner wall and the outer wall, wherein a width of the large deposition cavity is about 0.35 inches to about 0.60 inches, wherein the outer wall includes an outer ledge and an inner ledge raised with respect to the outer ledge; wherein an inner surface of the outer wall includes a vertical portion and a rounded portion extending from the vertical portion to a bottom surface of the large deposition cavity; and wherein an outer surface of the inner wall includes a vertical portion and a rounded portion extending from the vertical portion to the bottom surface of the large deposition cavity.

In some embodiments, a deposition ring for use in a process chamber, includes: an annular body; an inner wall extending upward from an inner portion of the annular body; and an outer wall extending upward form an outer portion of the annular body to define a large deposition cavity between the inner wall and the outer wall, wherein the outer wall includes an inner ledge and an outer ledge, wherein the inner ledge is raised with respect to the outer ledge, wherein a width of the large deposition cavity is about 0.35 inches to about 0.60 inches and a height measured from a bottom surface of the large deposition cavity to a top surface of the inner wall is about 0.05 inches to about 0.20 inches in height.

In some embodiments, a process kit for use in a process chamber, includes: a deposition ring having an annular body, an inner wall extending upward from an inner portion of the annular body, an outer wall extending upward form an outer portion of the annular body to define a large deposition cavity having a U-shaped profile between the inner wall and the outer wall, wherein the outer wall includes an inner ledge and an outer ledge, wherein the inner ledge is raised with respect to the outer ledge, and wherein a width of the large deposition cavity is about 0.35 inches to about 0.60 inches; and a cover ring having an annular body, an inner leg extending downward from the annular body, an inner lip extending radially inward from the annular body, and a ledge extending between the inner leg and the inner lip, wherein the ledge is configured to rest on the outer ledge of the deposition ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
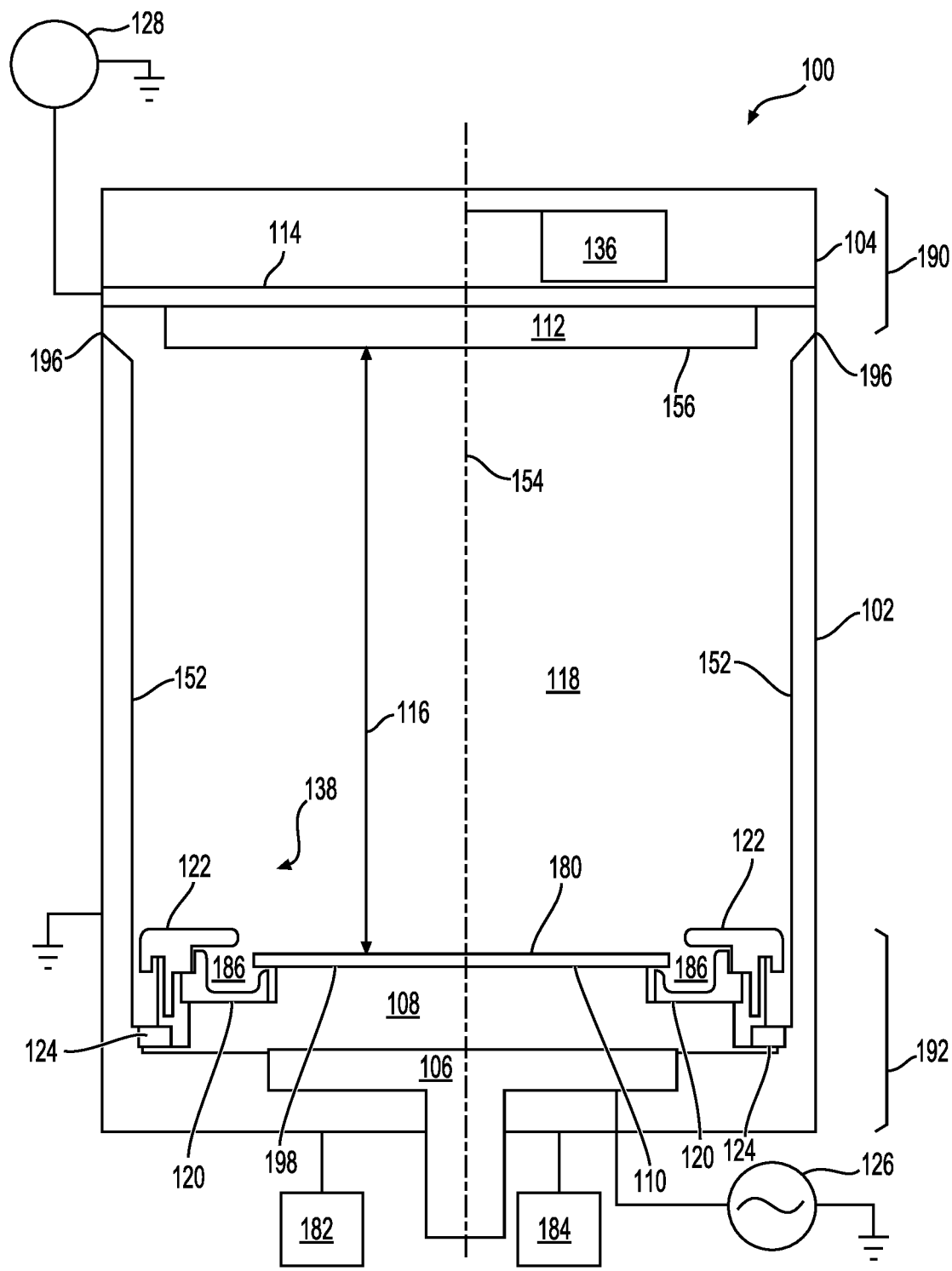
FIG. 1 depicts a schematic side view of a PVD chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of deposition rings and process chambers incorporating such deposition rings are provided herein. In some embodiments, the deposition ring includes a wide pocket. The deposition ring advantageously allows increased accumulation of deposited material on the deposition ring while maintaining structural integrity of the deposition ring. As a result, the deposition ring may undergo more process cycles prior to cleaning since deposition does not adhere to the backside of the substrate being process as quickly when compared to conventional deposition rings. The deposition ring may be used in a process chamber, for example a physical vapor deposition (PVD) chamber for high aspect ratio structure depositions. For example, the PVD chamber may be configured to deposit copper or tantalum on through silicon vias (TSV) structures.

FIG. 1 is a cross-sectional view of a PVD chamber 100 according to some embodiments. The PVD chamber 100 may be used for the deposition of tantalum, copper, and other materials onto a substrate 110 which may contain semiconductor structures such as TSVs and the like. The PVD chamber 100 includes a chamber body 102 and a source 190 that includes a magnetron assembly 104 and a target 112. The substrate 110 is supported on substrate support assembly 192 that includes an electrostatic chuck (ESC) 108 which is supported by a substrate support pedestal 106. One or more gases may be supplied from a gas source 184 into a lower part of the PVD chamber 100. A pump 182 is connected to the PVD chamber 100 for exhausting the interior of the PVD chamber 100 and to facilitate maintaining a desired pressure inside the PVD chamber 100.

At the top of a processing volume 118, is the target 112 with a backing plate 114. In some embodiments, in order to reduce the amount of neutral atoms reaching the substrate 110, the distance 116 between a lowermost surface 156 of the target 112 and a top surface 180 of the substrate 110 is approximately 400 mm. The 400 mm spacing provides improved gap fill on TSV structures. In some embodiments, the target 112 may be titanium, tantalum, tungsten, or the like. A DC power source 128 provides DC power to the target 112 via the backing plate 114 to sputter the target 112 during processing. The backing plate 114 may comprise a conductive material, such as copper-zinc, copper-chrome, or the same material as the target 112, such that DC power can be coupled to the target 112 via the backing plate 114. Alternatively, the backing plate 114 may be non-conductive and may include conductive elements (not shown) such as electrical feedthroughs or the like. The backing plate 114 may be disc shaped, rectangular, square, or any other shape that may be accommodated by the PVD chamber 100. The backing plate 114 is configured to support the target 112 such that a front surface of the target 112 opposes the substrate 110 when present. The target 112 may be coupled to the backing plate 114 in any suitable manner. For example, in some embodiments, the target 112 may be diffusion bonded to the backing plate 114. The magnetron assembly 104 includes a plurality of magnets 136 that travel over the target 112 about a central axis 154.

In TSV applications, the deposition rate decreases over the target life which also decreases the throughput of a process chamber. To keep the deposition rate constant through the target life, the target voltages are kept constant. Target voltages can be controlled by moving the plurality of magnets 136 in a vertical or Z direction. In some embodiments, the magnetron assembly 104 is capable of vertical movement (Z direction) to control the distance from the plurality of magnets 136 to the lowermost surface 156 (substrate facing surface) of the target 112 to ensure that the distance remains substantially constant. The source 190 may incorporate a coolant feed to maximize the target life.

An RF bias power source 126 may be coupled to the substrate support assembly 192 in order to induce a negative DC bias on the substrate 110. In addition, in some embodiments, a negative DC self-bias may form on the substrate 110 during processing. For example, RF energy supplied by the RF bias power source 126 may range in frequency from about 2 MHz to about 60 MHz. In some embodiments, DC power may be supplied to the target 112 from a DC power source 128. In other applications, the substrate support assembly 192 may be grounded or left electrically floating.

The PVD chamber 100 further includes a process kit 138 to protect other chamber components from damage and/or contamination from processing. In some embodiments, the process kit 138 includes a shield 152 to surround the processing volume 118 of the PVD chamber 100. In some embodiments, the shield 152 may be grounded at an uppermost point 196 to the chamber body to provide an RF ground return path. The shield 152 extends downwardly and may include a generally tubular portion having a generally constant diameter that generally surrounds the processing volume 118. In some embodiments, the process kit 138 includes a cover ring 122 and a deposition ring 120 surrounding the substrate support assembly 192. The shield 152 extends along the walls of the chamber body 102 downwardly to below an uppermost surface 198 of an ESC 108 and returns upwardly until reaching the cover ring 122 (e.g., forming a u-shaped portion at the bottom of the shield 152). The cover ring 122 rests on the top of an upwardly extending inner portion of the shield 152 when the substrate support assembly 192 is in a lower, loading position but rests on the outer periphery of the deposition ring 120 when in an upper, deposition position to protect the substrate support assembly 192 from sputter deposition. The deposition ring 120 may be used to protect the edges of the substrate support assembly 192 including substrate support pedestal and/or the ESC 108 from deposition around the edge of the substrate 110. The deposition ring 120 has a large deposition cavity 186 that advantageously allows more deposition buildup before the deposition ring 120 needs to be replaced.

Substrate processing systems using RF generated plasmas, require a return path for RF currents generated during processing back to a source, such as the RF power source that supplied the current. In some cases, the return path may include the current traveling through a substrate support (e.g., ESC) along a floor of the processing system and then ultimately along a wall and/or shield of the processing system back to the source. When operating under certain processing conditions, arcing between chamber components, such as between the substrate support assembly 192 (including the ESC 108 and/or substrate support pedestal 106) and adjacent chamber components, and/or stray plasma can undesirably occur, leading to component damage and/or generation of particles that can further undesirably contaminate a substrate disposed in the chamber. Inside the processing volume 118, the process kit 138 may be grounded to the chamber body 102 and provide the main return for the plasma current.

In some embodiments, the PVD chamber 100 may include one or more grounding loops 124 that electrically connect the substrate support assembly 192 (e.g., the ESC 108 and/or substrate support pedestal 106) to the shield 152. The grounding loops 124 are loops that compress to provide contact with the shield 152 when the substrate support assembly 192 is in a raised process position.

Figure 2:
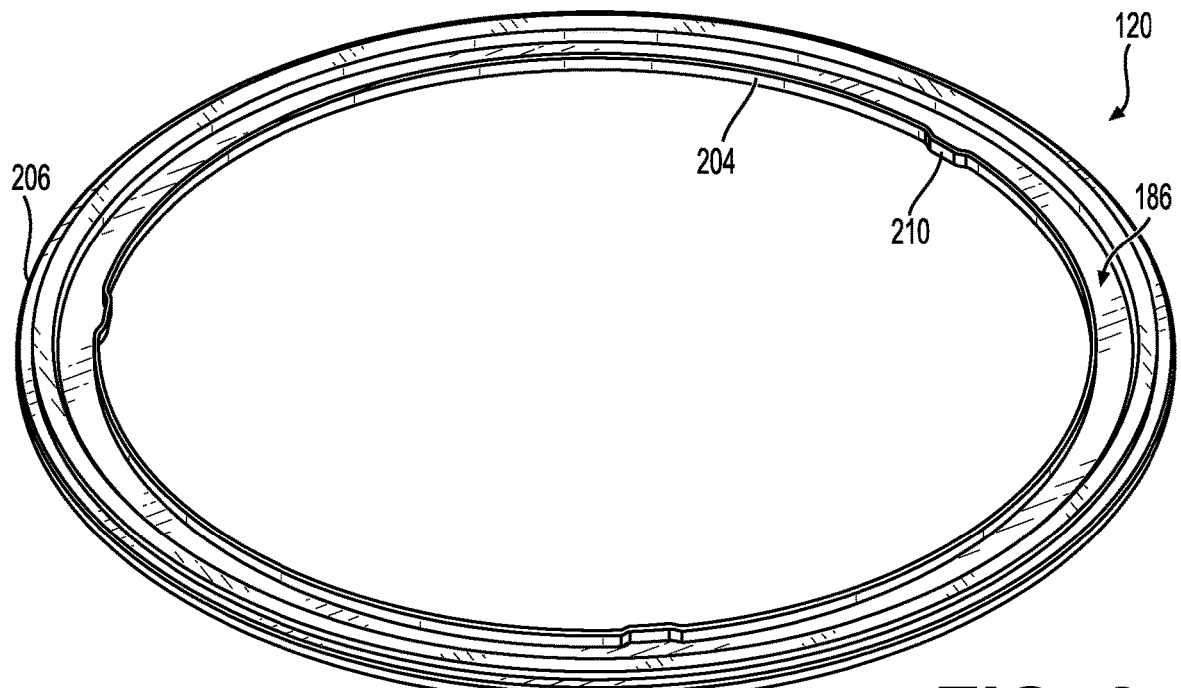
FIG. 2 depicts an isometric view of a deposition ring in accordance with some embodiments of the present disclosure.

FIG. 2 depicts an isometric view of the deposition ring 120 in accordance with some embodiments of the present disclosure. The deposition ring 120 surrounds the ESC 108 and prevents unwanted stray plasma and depositions on or near the ESC 108 and/or substrate support pedestal 106. The deposition ring 120 has a large deposition cavity 186 disposed between an inner surface 204 of the deposition ring 120 and an outer surface 206 of the deposition ring 120 that permits more deposition deposits to buildup, increasing the maintenance interval and reducing wafer arcing during high voltage TSV deposition processes. In some embodiments, the deposition ring 120 includes a plurality of tabs 210 extending radially inward from the inner surface 204 of the deposition ring 120 to align the deposition ring 120 with the ESC 108 and/or prevent rotation with respect to the ESC 108. In some embodiments, the plurality of tabs 210 consist of three tabs that are spaced along regular intervals along the inner surface 204.

Figure 3:
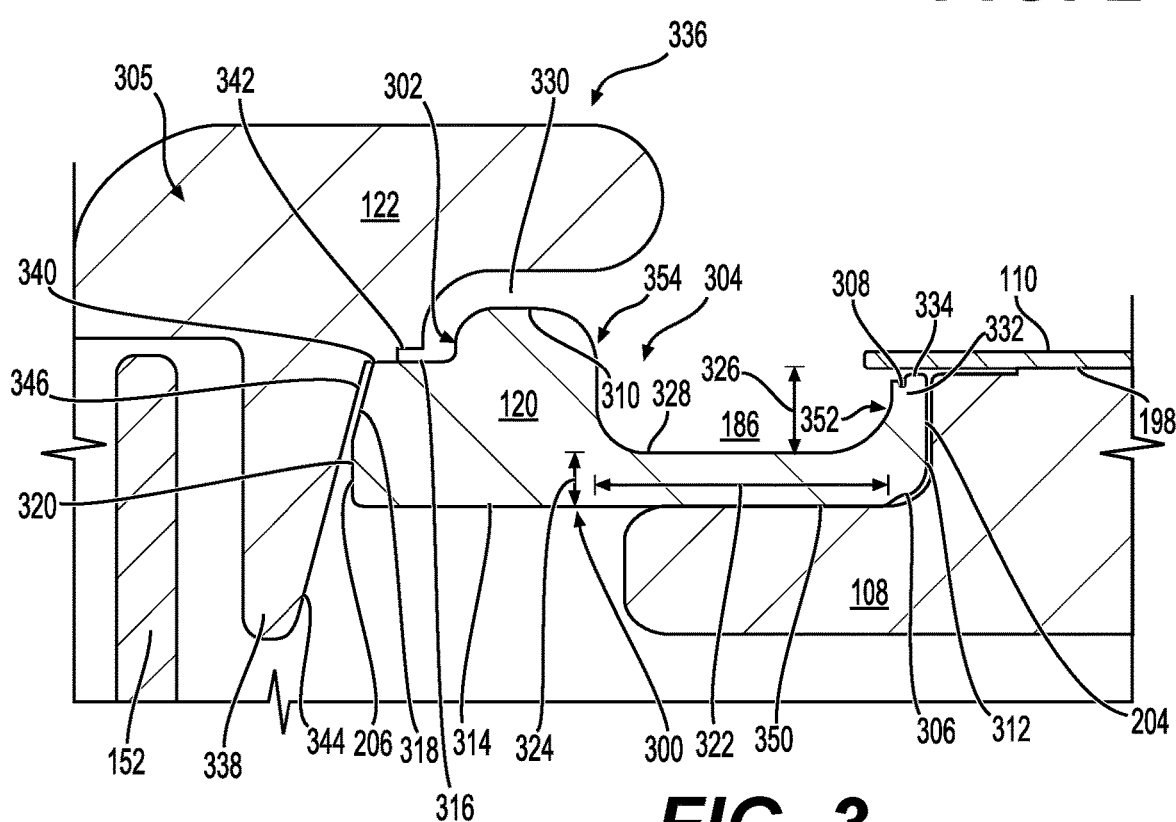
FIG. 3 depicts a partial cross-sectional view of a process kit including a deposition ring in accordance with some embodiments of the present disclosure.

FIG. 3 depicts a partial cross-sectional side view of process kit including a deposition ring in accordance with some embodiments of the present disclosure. The deposition ring 120 is interposed between the ESC 108 and the cover ring 122 which interfaces with the shield 152. The deposition ring 120 rests on an outer ledge 350 of the ESC 108. A first gap 312 is disposed between the inner surface 204 of the deposition ring 120 and the ESC 108 to ensure that the deposition ring 120 may fit about the ESC 108.

The deposition ring 120 is made of stainless steel, aluminum oxide, titanium, or other suitable material. The deposition ring 120 generally consists of an annular body 300, an outer wall 304 extending upward from the annular body 300, and an inner wall 332 extending upward from the annular body 300. In some embodiments, the outer wall 304 extends farther from the annular body 300 than the inner wall 332. In some embodiments, the inner wall 332 includes an outer notch 308 at a top outer peripheral edge of the inner wall 332 to facilitate the accumulation of deposition deposits within the outer notch 308 and reduce deposition deposits from passing through the first gap 312.

The large deposition cavity 186 is defined between the outer wall 304 and the inner wall 332. In some embodiments, the large deposition cavity 186 is generally a U-shaped profile. In some embodiments, a bottom surface 328 of the large deposition cavity 186 is substantially horizontal to collect straight deposition deposits. In some embodiments, an outer surface 352 of the inner wall 332 includes a vertical portion. In some embodiments, the outer surface 352 includes an upper rounded portion extending from the vertical portion to a top surface 334 of the inner wall 332. In some embodiments, the outer surface 352 includes a lower rounded portion extending from the vertical portion to the bottom surface 328 of the large deposition cavity 186. In some embodiments, an inner surface 354 of the outer wall 304 includes a vertical portion. In some embodiments, the inner surface 354 includes an upper rounded portion extending from the vertical portion to an upper surface of the outer wall 304. In some embodiments, the inner surface 354 includes a lower rounded portion extending from the vertical portion to the bottom surface 328 of the large deposition cavity 186. The vertical portion of the outer wall 304 and the vertical portion of the inner wall 332 are configured to collect angled line of sight deposition deposits. As such, the geometry of the large deposition cavity advantageously collects straight deposition deposits and angle line of sight deposition deposits.

In some embodiments, the large deposition cavity 186 is about 0.35 inches to about 0.60 inches in width denoted by a first distance 322. In some embodiments, the large deposition cavity 186 is about 0.05 inches to about 0.20 inches in height measured from a bottom surface 328 of the large deposition cavity 186 to the top surface 334 of the inner wall 332 denoted by a second distance 326. In some embodiments, the large deposition cavity 186 is about 0.48 inches to about 0.55 inches wide by about 0.12 inches to about 0.16 inches high. In some embodiments, a thickness 324 of the annular body 300 between the bottom surface 328 of the large deposition cavity 186 and a lower surface 314 of the deposition ring 120 is optimized to reduce or prevent cracking of the deposition ring 120 when exposed to many process cycles and exposed to larger accumulation of deposition deposits. In some embodiments, the thickness 324 is about 0.05 inches to about 0.15 inches to maintain structural integrity of the deposition ring 120 and reduce or prevent cracking.

In some embodiments, the lower surface 314 includes a lower notch 306 at a radially inner portion of the lower surface 314 adjacent the inner surface 204 of the deposition ring. The inventors have observed that over time deposition deposits may pass through the first gap 312. The lower notch 306 advantageously allows for accumulation of the deposition deposits through the first gap 312, reducing or preventing issues related to sticking between the deposition ring 120 and the ESC 108 or the deposition ring 120 not sitting flat on the outer ledge 350 of the ESC 108. In some embodiments, an outermost portion of the lower notch 306 is disposed radially inward of the large deposition cavity 186.

In some embodiments, the lower surface 314 is substantially horizontal except for the lower notch 306. In some embodiments, an inner surface of the inner wall 332 extends substantially vertically from the top surface 334 of the wall to the lower notch 306.

In some embodiments, the outer wall 304 includes an inner ledge 310 and an outer ledge 316. In some embodiments, the inner ledge 310 is raised with respect to the outer ledge 316. In some embodiments, the inner ledge 310 is raised about 0.05 inches to about 0.15 inches with respect to the outer ledge 316. In some embodiments, an upper surface of the outer ledge 316 is substantially horizontal. In some embodiments, the outer ledge 316 includes rounded corners on either side of the upper surface of the outer ledge 316. In some embodiments, the upper surface of the outer ledge 316 is substantially horizontal without any grooves or channels. In some embodiments, an upper surface of the inner ledge 310 is substantially horizontal. In some embodiments, an outer surface of the outer ledge 316 defines the outer surface 206 of the deposition ring. In some embodiments, the outer surface 206 includes an upper portion 318 and a lower portion 320. In some embodiments, the upper portion 318 extends an angle with respect to the lower portion 320. In some embodiments, the lower portion 320 is substantially vertical. In some embodiments, the upper portion 318 extends radially inward from the lower portion 320 to the upper surface of the outer ledge 316.

In some embodiments, an upper surface 302 of the deposition ring 120 extends from the top surface 334 of the inner wall 332 to the surfaces that define the large deposition cavity 186 to the upper surface of the inner ledge 310 down an outer sidewall of the inner ledge 310 to the upper surface of the outer ledge 316. In some embodiments, all or some portions (e.g., surfaces of the large deposition cavity 186, surfaces of the large deposition cavity and outer surfaces of the inner ledge 310) of the upper surface 302 of the deposition ring 120 includes a coating. In some embodiments, the coating is aluminum oxide (also known as alumina) via arc spray processes to increase a surface roughness of the upper surface 302 to enhance accumulation of the deposition deposits.

The cover ring 122 is made of stainless steel, aluminum oxide, titanium, or other suitable material. The cover ring 122 generally has an annular body 305 and an inner lip 336 that extends radially inward from the annular body 305 over a portion of the deposition ring 120. In some embodiments, the inner lip 366 extends radially inward beyond the outer wall 304 of the deposition ring 120. A second gap 330 is disposed between the inner lip 336 and the deposition ring 120 to allow for some accumulation of deposition deposits on the deposition ring 120 and prevent sticking between the cover ring 122 and the deposition ring 120. In some embodiments, the second gap 330 is defined between a lower surface of the inner lip 336 and a top surface of the outer wall 304. In some embodiments, the second gap 330 is about 0.02 inches to about 0.1 inches.

In some embodiments, the cover ring 122 includes an inner leg 338 extending downwards from the annular body 305. A ledge 340 extends between the inner leg 338 and the inner lip 336. In some embodiments, the ledge 340 extends horizontally from the inner leg 338 to the inner lip 336. In some embodiments, the ledge 340 includes a step 342 at a radially inner portion of the ledge 340. In some embodiments, the second gap 330 extends between an outer surface of the outer wall 304 and a radially inner edge of the ledge 340.

In some embodiments, the inner leg 338 includes an inner surface 344 that opposes the outer surface 206 of the deposition ring 120. In some embodiments, the inner surface 344 is angled with respect to the lower surface of the ledge 340. In some embodiments, the inner surface 344 is angled corresponding to an angle of the upper portion 318 of the outer surface 206 of the deposition ring 120. In some embodiments, the lower surface of the ledge 340 mates with the outer ledge 316 of the deposition ring 120 when in the upper, deposition position. In some embodiments the deposition ring 120 and the cover ring 122 only contact each other at an interface between the ledge 340 of the cover ring 122 and the outer ledge 316 of the deposition ring 120 to advantageously minimize particulate generation therebetween. A third gap 346 is disposed between the outer surface 206 of the deposition ring 120 and the inner surface 344 of the cover ring 122 to advantageously allow for movement of the deposition ring 120 due to thermal expansion and/or contraction of the deposition ring 120 relative to the cover ring 122.

While the foregoing is directed to embodiments of the present disclosure, other and further embodiments of the disclosure may be devised without departing from the basic scope thereof.

The invention claimed is:

1. A deposition ring for use in a process chamber, comprising:
   an annular body;
   an inner wall extending upward from an inner portion of the annular body; and
   an outer wall extending upward form an outer portion of the annular body to define a large deposition cavity between the inner wall and the outer wall, wherein a width of the large deposition cavity is about 0.35 inches to about 0.60 inches, wherein the outer wall includes an outer ledge and an inner ledge raised with respect to the outer ledge;
   wherein an inner surface of the outer wall includes a vertical portion and a rounded portion extending from the vertical portion to a bottom surface of the large deposition cavity, and a rounded portion extending radially outward from the vertical portion to the inner ledge; and
   wherein an outer surface of the inner wall includes a vertical portion and a rounded portion extending from the vertical portion to the bottom surface of the large deposition cavity.

2. The deposition ring of claim 1, wherein the inner ledge is raised about 0.05 inches to about 0.15 inches with respect to the outer ledge.

3. The deposition ring of claim 1, wherein the width of the large deposition cavity is greater than a width of the outer wall.

4. The deposition ring of claim 1, wherein a height of the large deposition cavity from a bottom surface of the large deposition cavity to a top surface of the inner wall is about 0.05 inches to about 0.20 inches.

5. The deposition ring of claim 1, wherein a thickness of the annular body between the bottom surface of the large deposition cavity and a lower surface of the annular body is about 0.05 inches to about 0.15 inches.

6. The deposition ring of claim 1, wherein a lower surface of the annular body includes a lower notch at a radially inner portion of the lower surface adjacent the inner surface of the annular body.

7. The deposition ring of claim 1, wherein the inner wall includes an outer notch at a top outer peripheral edge of the inner wall.

8. The deposition ring of claim 1, wherein an upper surface of the outer ledge is substantially horizontal without any grooves or channels.

9. The deposition ring of claim 1, wherein an outer surface of the outer ledge includes an upper portion and a lower portion, wherein the upper portion extends an angle with respect to the lower portion.

10. A deposition ring for use in a process chamber, comprising:
    an annular body;
    an inner wall extending upward from an inner portion of the annular body; and
    an outer wall extending upward form an outer portion of the annular body to define a large deposition cavity between the inner wall and the outer wall, wherein the outer wall includes an inner ledge and an outer ledge, wherein the inner ledge is raised with respect to the outer ledge, wherein a width of the large deposition cavity is about 0.35 inches to about 0.60 inches and a height measured from a bottom surface of the large deposition cavity to a top surface of the inner wall is about 0.05 inches to about 0.20 inches in height, wherein the width of the large deposition cavity is greater than a width of the outer wall.

11. The deposition ring of claim 10, wherein a lower surface of the annular body includes a lower notch at a radially inner portion of the lower surface adjacent the inner surface of the annular body, wherein an outermost portion of the lower notch is disposed radially inward of the large deposition cavity.

12. The deposition ring of claim 10, wherein an outer surface of the outer ledge includes an upper portion and a lower portion, wherein the lower portion is substantially vertical and the upper portion extends an angle with respect to the lower portion to an upper surface of the outer ledge.

13. The deposition ring of claim 10, wherein an inner surface of the outer wall includes a vertical portion and a rounded portion extending from the vertical portion to a bottom surface of the large deposition cavity.

14. The deposition ring of claim 10, wherein surfaces of the large deposition cavity includes an aluminum oxide coating.

15. A process kit for use in a process chamber, comprising:
    a deposition ring having an annular body, an inner wall extending upward from an inner portion of the annular body, an outer wall extending upward form an outer portion of the annular body to define a large deposition cavity having a U-shaped profile between the inner wall and the outer wall, wherein the outer wall includes an inner ledge and an outer ledge, wherein the inner ledge is raised with respect to the outer ledge, wherein the outer ledge is a radially outermost horizontal surface of the deposition ring, and wherein a width of the large deposition cavity is about 0.35 inches to about 0.60 inches; and
    a cover ring having an annular body, an inner leg extending downward from the annular body, an inner lip extending radially inward from the annular body, and a ledge extending between the inner leg and the inner lip, wherein the ledge is configured to rest on the outer ledge of the deposition ring.

16. The process kit of claim 15, wherein an outer surface of the outer ledge includes an upper portion and a lower portion, wherein the lower portion is substantially vertical and the upper portion extends an angle with respect to the lower portion to an upper surface of the outer ledge.

17. The process kit of claim 16, wherein an inner surface of the inner leg of the cover ring is angled similar to the angle of the upper portion of the outer surface of the deposition ring.

18. The process kit of claim 15, further comprising a gap of about 0.02 inches to about 0.1 inches between a lower surface of the inner lip of the cover ring and a top surface of the outer wall when the cover ring rests on the deposition ring.

19. The process kit of claim 15, the ledge of the cover ring includes a step at a radially inner portion of the ledge.

20. The process kit of claim 15, wherein the inner lip extends radially inward beyond the outer wall of the deposition ring.

* * * * *